Figure 1:
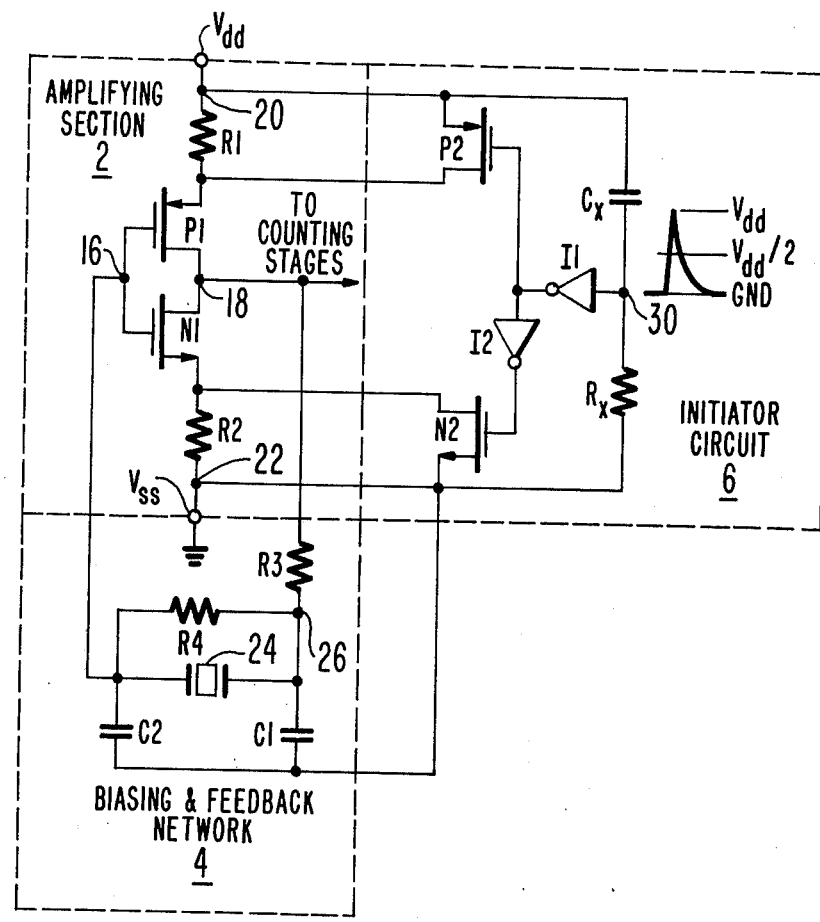

United States Patent [19]

Heuner

[11] 4,282,496
[45] Aug. 4, 1981

[54] STARTING CIRCUIT FOR LOW POWER OSCILLATOR CIRCUIT

[75] Inventor: Robert C. Heuner, Bound Brook, N.J.

[73] Assignee: RCA Corporation, New York, N.Y.

[21] Appl. No.: 70,703

[22] Filed: Aug. 29, 1979

[51] Int. Cl.³ .......................... H03B 5/06; H03B 5/36
[52] U.S. Cl. ............................. 331/116 FE; 331/158
[58] Field of Search ............. 331/116 FE, 116 R, 158; 363/159, 167

[56] References Cited

U.S. PATENT DOCUMENTS

| | | | |
|---|---|---|---|
| 3,725,822 | 4/1973 | Eaton Jr. | 331/116 FE X |
| 3,935,546 | 1/1976 | Morozumi et al. | 331/116 FE |
| 3,939,644 | 2/1976 | Wolf | 331/116 FE X |
| 3,965,442 | 6/1976 | Eaton Jr. | 331/116 FE |
| 3,979,698 | 9/1976 | Gollinger | 331/116 FE |
| 4,039,973 | 8/1977 | Yamashiro | 331/116 FE |
| 4,064,468 | 12/1977 | Kumata | 331/116 FE |
| 4,095,195 | 6/1978 | Saito | 331/116 FE |
| 4,218,661 | 8/1980 | Imamura | 331/116 FE |

FOREIGN PATENT DOCUMENTS 50-97732  2/1977  Japan .................................. 331/116 FE
50-105766  3/1977  Japan .................................. 331/116 FE Primary Examiner—Siegfried H. Grimm
Attorney, Agent, or Firm—Samuel Cohen; Henry I. Schanzer

[57] ABSTRACT

A network for initiating oscillations of a low power oscillator circuit at low operating voltages. The oscillator circuit includes an inverter with a quartz crystal connected between its input and output and with impedance means connected in series with the main conduction path of the inverter to reduce its power dissipation. The initiation network includes a switching means which is connected in parallel with the impedance means and which is responsive to the application of an operating potential to the oscillator circuit for momentarily providing a low impedance conduction path in parallel with the impedance means when an operating potential is applied to the circuit.

9 Claims, 4 Drawing Figures

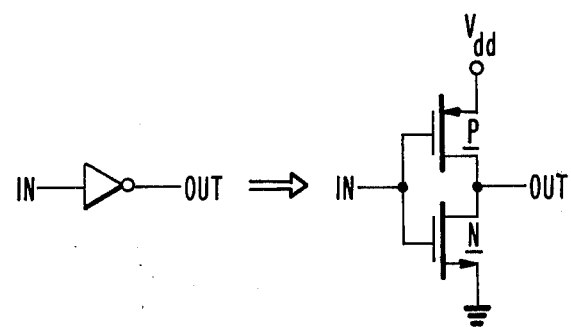
*Fig. 2.*
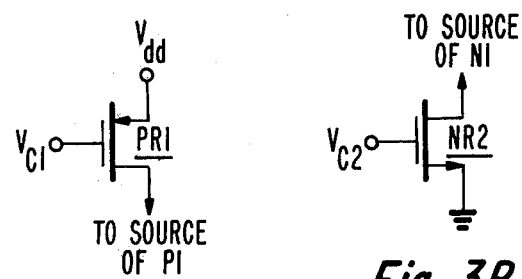
*Fig. 3A.*  *Fig. 3B.*

STARTING CIRCUIT FOR LOW POWER OSCILLATOR CIRCUIT

This invention relates to oscillator circuits and, in particular, to a circuit for initiating oscillations of a low power oscillator at low operating voltages.

Oscillator circuits such as disclosed, for example, in U.S. Pat. No. 3,725,822 issued to S. S. Eaton, Jr., include an amplifying section and a feedback network. For oscillation to occur two criteria known as the Barkhausen criteria have to be met. These are: (1) that the gain ($\alpha$) of the amplifying section multiplied by the attenuation ratio ($\beta$) of the feedback network be equal to or greater than one ($\alpha\beta > 1$); and (2) that the phase shift around the loop be equal to n.360°, where n is an integer equal to or greater than one. Normally, the amplifying section is designed to have a phase shift of approximately 180°, or an odd multiple thereof, and the feedback network in turn has a phase shift of 180° to provide the required 360° phase shift.

To reduce the power dissipation of the oscillator circuit and/or to stabilize the frequency of oscillation impedances such as resistors may be connected in series with the amplifying section. The addition of such impedances causes an increase in the time it takes the oscillator to reach its stable rate from the onset of oscillation. Also they decrease the gain of the amplifying means and increase the minimum operating voltage needed to initiate oscillations. However, it has been learned that once oscillations are initiated, the operating voltage may be reduced while oscillations are sustained.

Oscillator circuits embodying the invention include a network for aiding the initiation of oscillations. The oscillator circuit includes impedance means connected in series with the main conduction path of the oscillator's amplifying means. The oscillation initiation network includes means for momentarily shunting the impedance means whenever power is applied to the oscillator circuit.

In the accompanying drawing like reference characters denote like components; and FIG. 1 is a schematic diagram of an oscillator circuit embodying the invention, FIG. 2 is a schematic diagram of a typical inverter which may be used in the circuit of FIG. 1; and FIGS. 3A and 3B are schematic diagrams of transistors which may be used to produce the impedances represented by resistors R1 and R2 in FIG. 1.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral; and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude than a given value, which is defined as the threshold voltage ($V_T$) of the transistor. To turn on a P type transistor its gate voltage ($V_G$) has to be more negative than its source voltage ($V_S$) by at least $V_T$. To turn on a N type transistor its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e., the source and drain are interchangeable.

FIG. 1 shows an oscillator circuit which includes an amplifying section 2, a biasing and feedback network 4, and an initiator or low voltage starting network 6. The amplifying section 2 includes a complementary inverter comprising P-type transistor P1 and N-type transistor N1 whose gates are connected to the amplifier's input node 16 and whose drains are connected to the amplifier's output node 18. The source electrode of P1 is returned via resistor R1 to terminal 20 to which is applied a potential of $V_{dd}$ volts. The source electrode of N1 is returned via resistor R2 to terminal 22 to which is applied ground potential which is negative with respect to $V_{dd}$.

The biasing and feedback network 4 includes resistor R3 connected between nodes 18 and 26 and resistor R4 connected in series with R3 between nodes 26 and 16. A quartz crystal 24 is connected between nodes 26 and 16, a capacitor C1 is connected between node 26 and ground, and a capacitor C2 is connected between node 16 and ground.

The initiator circuit 6 includes a high pass filter which may also be considered as a differentiator circuit comprised of a capacitor $C_X$ connected between nodes 20 and 30 and a resistor $R_X$ connected between nodes 30 and 22.

Node 30 is connected to the input of an inverter I1 whose output is connected to the gate of a P-type transistor P2 and to the input of an inverter I2. The source-to-drain path of P2 is connected across resistor R1. The output of inverter I2 is connected to the gate of an N-type transistor N2 whose source-to-drain path is connected across resistor R2. Inverters I1 and I2 may be complementary inverters of the type detailed in FIG. 2. Each inverter includes a P-type transistor and an N-type transistor with the two transistors having their gates connected in common to the inverter input and having their drains connected in common to the inverter output. The source of the P transistor of an inverter is directly returned to $V_{dd}$ and the source of the N transistor is directly returned to $V_{ss}$ (ground). In the discussion to follow, assume that the switching point of the inverters is $V_{dd}/2$. That is for an input signal above $V_{dd}/2$ its output is at ground and for an input signal below $V_{dd}/2$ its output is at $V_{dd}$.

Whenever $V_{dd}$ is applied (by a switch closure or the making of a connection, not shown) to node 20 the RC differentiator circuit $R_X C_X$ produces a positive going spike with a subsequent decaying edge at node 30, as shown.

As soon, and as long, as the positive going spike is more positive than $V_{dd}/2$ the output of I1 is at ground potential. This applies ground potential to the gate of P2 and the input of I2. Consequently, P2 is turned-on shunting R1. The source of P1 is now connected to $V_{dd}$ via a relatively low impedance path since R1 is now in parallel with the source-drain path of P2 which is turned on hard. P2 may be a large size device having a low source-drain impedance when ON.

Concurrently, the output of I2 is driven to $V_{dd}$ and transistor N2 is turned-on hard shunting R2. The source of N1 is now connected to ground via a relatively low impedance since R2 is now in parallel with the source-drain path of N2 which is turned-on hard. N2, as P2, may be a large size device having a low source-drain impedance when ON. P2 and N2 continue to be turned on until the spike at node 30 decreases below $V_{dd}/2$.

When the sources of P1 and N1 are returned via low impedances to $V_{dd}$ and ground, respectively, the full operating potential ($V_{dd}$) is applied across P1 and N1. Oscillation can be initiated at a relatively low operating voltage and the amplifier quickly brought to the operating point resulting in the desired operating frequency. Inverters I1 and/or I2 can respond as soon as the operating potential exceeds the threshold voltage ($V_T$) of either one of its P and N devices. (The $V_T$ of the P and N devices are assumed to be approximately equal). Consequently, the oscillator can be driven into operation and sustain oscillations as soon as the operating voltage exceeds somewhat, a value equal to the $V_T$ of the transistors in its amplifying section.

The value of $C_X$ and $R_X$ are selected to allow P2 and N2 to be turned on long enough to initiate oscillations and to set the oscillator to the desired frequency.

After the initiation of oscillations (and with the continued application of $V_{dd}$ volts), transistors P2 and N2 are turned off. Resistors R1 and R2 are then in series with P1 and N1 and limit the maximum current and hence the power dissipation of the oscillator. However, as noted above, oscillations, once initiated, will be sustained even with a considerable reduction in the current through the amplifier.

The initiation circuit 6 has been shown to be directly dependent on the application of $V_{dd}$. It should be evident that the initiation circuit could also be made dependent on the presence or absence of signals at output node 18. Thus, the turn-on of P2 and N2 could be made to depend on the application of $V_{dd}$ and the absence of an output at node 18. P2 and N2 could be made to turn-off depending on a signal at node 18 or a signal derived from counting stages connected to node 18.

The operation of the circuit once oscillation is initiated is known and need not be detailed. Assume, for example, a small falling signal ($V_{IN}$) applied to the input node 16 of the inverter 2. The inverter has an inherent 180° phase shift between its input and output nodes and produces, in response to $V_{IN}$, a signal $V_{18}$ at its output node 18. The signal $V_{18}$ is a rising waveform of amplitude $\alpha V_{IN}$ which is inverted, that is, phase shifted by 180°, with respect to the input signal $V_{IN}$. The output of the inverter is then applied to the feedback circuit 4 which attenuates the signal by a factor $\beta$ and phase shifts it an additional 180°. The output of the feedback network is then fed-back to the input node 16 of amplifier 2. The amplitude of the signal fed-back to the input node is equal ($\alpha$) ($\beta$) $V_{IN}$ and is in phase with the exciting signal $V_{IN}$. This assumes that the total phase shift around the loop—the phase shift of the amplifier plus that of the feedback network—is equal to 360°.

If the product of $\alpha\beta$ is equal to 1, then the signal fed-back to the input node is equal to the excitation signal and the system is such that oscillations once initiated will be sustained. If the product of $\alpha\beta$ is greater than one, the feedback signal will be greater than the excitation signal and the circuit is such that oscillations always will be initiated. The circuit parameters are, therefore, selected so that $\alpha\beta$ is greater than 1 when P2 and N2 are turned on.

Resistors R1 and R2 could be replaced by the source-to-drain paths of transistors biased into conduction as shown in FIGS. 3A and 3B. That is, R1 could be replaced by a transistor PR1 whose source-drain path is connected between node 20 and the source of P1 and to whose gate electrode is applied a potential $V_{C1}$ for controlling its conductivity. Similarly, R2 could be replaced by a transistor NR2 whose source-drain path is connected between the source of N1 and node 22 and to whose gate electrode is applied a potential $V_{C2}$ for controlling its conductivity. In other respects the system is the same as shown in FIG. 1.

What is claimed is:

1. The combination comprising:
   first and second power terminals adapted to receive an operating potential;
   amplifying means having first and second electrodes for the application therebetween of an operating potential and having an input and an output;
   regenerative feedback means connected between said input and said output for causing oscillations to be produced when a sufficient voltage is present across said first and second electrodes;
   impedance means connected in series with said first and second electrodes between said first and second power terminals;
   switching means connected across said impedance means for providing a low impedance conduction path in parallel with said impedance means, when turned on; and
   means responsive to the application of an operating potential across said first and second power terminals, said means including a differentiating circuit coupled across said first and second power terminals for producing a relatively narrow pulse each time said operating potential is applied across said first and second power terminals, and means responsive to said relatively narrow pulse coupled to said switching means for turning on said switching means momentarily each time an operating potential is applied across said first and second terminals.

2. The combination as claimed in claim 1 wherein said impedance means is a resistor.

3. The combination as claimed in claim 1 wherein said switching means is a transistor having a conduction path and a control electrode, said conduction path being connected across said impedance means; and
   wherein said differentiating circuit includes a capacitor connected in series with a resistor between said first and second power terminals, and wherein said means responsive to said relatively narrow pulse includes an amplifier responsive to the signal produced at the junction on said capacitor and said resistor for controlling the turn-on and turn-off of said transistor.

4. The combination as claimed in claim 1 wherein said amplifying means includes first and second transistors of complementary conductivity type, each transistor having a source, a drain and a gate;

wherein the gates of said first and second transistors are connected to, and define, said amplifying means input;

wherein the drains of said first and second transistors are connected to, and define, said amplifying means output;

wherein said impedance means includes a first resistor connected between the source of said first transistor and said first power terminal, and a second resistor connected between the source of said second transistor and said second power terminal;

wherein said switching means includes a third transistor having its conduction path connected across said first resistor, and a fourth transistor having its conduction path connected across said second resistor; and wherein said means responsive to the application of an operating potential includes means for turning on said third and fourth transistors momentarily and for then turning them off.

5. The combination as claimed in claim 4 wherein said regenerative feedback means includes a crystal.

6. The combination as claimed in claim 5 wherein said third transistor is of the same conductivity type as said first transistor, and wherein said fourth transistor is of the same conductivity type as said second transistor; and wherein said differentiating circuit includes a capacitor connected in series with a resistor between said first and second power terminals, and wherein said means responsive to said relatively narrow pulse includes a first inverter connected at its input to the junction of said resistor and capacitor and at its output to the control electrode of one of said third and fourth transistors, and a second inverter connected at its input to the output of said first inverter and at its output to the control electrode of the other one of said third and fourth transistors.

7. An oscillator comprising:

amplifier means having an input and an output terminal and two operating voltage terminals;

a regenerative feedback circuit connected between said input and output terminals;

first and second power terminals adapted to receive an operating potential;

impedance means, connected in series with said two operating voltage terminals between said first and second power terminals, through which operating current flows when an operating voltage is applied between said operating voltage terminals; and means including a differentiating circuit responsive to the application of said operating voltage between said first and second power terminals for momentarily shunting said impedance means to thereby reduce the time required for oscillations produced by the oscillator, to start.

8. An oscillator as set forth in claim 7, wherein said means for shunting comprises normally open switch means connected across said impedance means, and means for momentarily closing said switch means.

9. An oscillator as set forth in claim 8, wherein said switch means comprises a field-effect transistor, the conduction path of which is connected across said impedance means, and having also a gate electrode, and wherein said means responsive further comprises means responsive to the output of the differentiating circuit for applying a turn-on pulse to said gate electrode.

* * * * *